(12) United States Patent
Chambers et al.

(10) Patent No.: US 8,536,654 B2
(45) Date of Patent: Sep. 17, 2013

(54) STRUCTURE AND METHOD FOR DUAL WORK FUNCTION METAL GATE CMOS WITH SELECTIVE CAPPING

(75) Inventors: James Joseph Chambers, Dresden (DE); Hiroaki Niimi, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/006,185

(22) Filed: Jan. 13, 2011

(65) Prior Publication Data

US 2012/0018810 A1    Jan. 26, 2012

Related U.S. Application Data

(60) Provisional application No. 61/294,661, filed on Jan. 13, 2010.

(51) Int. Cl.
*H01L 29/76* (2006.01)

(52) U.S. Cl.
USPC ........... 257/369; 257/338; 257/351; 257/357; 257/371; 257/407; 257/E21.632; 257/E27.062; 257/E27.108; 438/199; 438/223

(58) Field of Classification Search
USPC .............. 257/338, 351, 357, 369, 371, 407, 257/E21.632, E27.062, E27.108; 438/199, 438/223
See application file for complete search history.

(56) References Cited

U.S. PATENT DOCUMENTS

| | | | |
|---|---|---|---|
| 6,255,698 B1 * | 7/2001 | Gardner et al. | 257/369 |
| 6,303,418 B1 * | 10/2001 | Cha et al. | 438/199 |
| 6,483,151 B2 * | 11/2002 | Wakabayashi et al. | 257/369 |
| 6,835,989 B2 * | 12/2004 | Lin et al. | 257/407 |
| 2008/0017930 A1 * | 1/2008 | Kim et al. | 257/369 |
| 2008/0290416 A1 * | 11/2008 | Yu et al. | 257/369 |
| 2010/0127336 A1 * | 5/2010 | Chambers et al. | 257/369 |

OTHER PUBLICATIONS

H. Kim et al, Engineering chemically abrupt high-k metal oxide/silicon interfaces using an oxygen-gettering metal overlayer, J. Appl. Phys. vol. 96, p. 3467 (2004).

* cited by examiner

*Primary Examiner* — Andy Huynh
(74) *Attorney, Agent, or Firm* — Jacqueline J. Garner; Wade J. Brady, III; Frederick J. Telecky, Jr.

(57) ABSTRACT

A CMOS device having an NMOS transistor with a metal gate electrode comprising a mid-gap metal with a low work function/high oxygen affinity cap and a PMOS transistor with a metal gate electrode comprising a mid gap metal with a high work function/low oxygen affinity cap and method of forming.

17 Claims, 8 Drawing Sheets

STRUCTURE AND METHOD FOR DUAL WORK FUNCTION METAL GATE CMOS WITH SELECTIVE CAPPING

This application claims the benefit of U.S. Provisional Application No. 61/294,661, filed Jan. 13, 2010.

FIELD OF THE INVENTION

The invention is generally related to the field of semiconductor devices and more specifically to dual work function metal gates in CMOS applications.

BACKGROUND OF THE INVENTION

The ability to dope polysilicon gates to different degrees allows one to adjust the work function of gate electrode materials to particular types of metal oxide semiconductor (MOS) transistors. It is desirable to adjust the work function of a gate electrode (hereinafter, the gate), to be close to either the conduction band or the valence band of silicon, because this reduces the threshold voltage ($V_t$) of the transistor, thereby facilitating a high drive current at low operating voltages. For instance, dual work function gates created using doped polysilicon are advantageously used in semiconductor devices, such as complementary metal oxide semiconductor (CMOS) transistor devices (i.e., devices having both PMOS and NMOS transistors). The use of doped polysilicon gates becomes problematic, however, as the dimensions of gates and gate insulators are reduced.

Metal gates are an attractive alternative to polysilicon because they have a larger supply of charge carriers than doped polysilicon gates. When a metal gate is biased to invert the channel, there is no substantial depletion of carriers at the interface between the metal gate and gate dielectric. Accordingly, the transistor's performance is not deteriorated because the electrical thickness of the gate stack is not increased. The manufacture of semiconductor devices having independently adjustable dual work function metal gates has been troublesome, however.

Ideally, dual work function metal gates should be compatible with conventional gate dielectric materials and have suitably adjustable and stable work functions. It is challenging, however, to find such metals. For instance, there have been attempts to use fully nickel silicided polysilicon as the gate for MOS transistors, with implanted dopants used to adjust the work function. During the annealing process to fully silicide the gate, however, the implanted dopants can interact with the gate dielectric. This can result in the same type of $V_t$ offset problem encountered for doped polysilicon. There is also the potential for nickel atoms to migrate into the gate dielectric and channel, thereby introducing defects that can degrade the performance, reliability, and stability of the device over time.

Others have attempted to use a hafnium nitride gate on a hafnium oxide gate dielectric. Such a gate has a mid-gap work function, meaning that the work function is about mid-way between the valence band and the conduction band of the substrate. Such mid-gap materials are unsatisfactory in a CMOS device, or other settings, where it is desirable to adjust the work function, in order to achieve a low $V_t$.

Accordingly, what is needed in the art is a method of manufacturing semiconductor devices having adjustable and stable metal gates.

SUMMARY OF THE INVENTION

The invention is a CMOS device having an NMOS transistor with a metal gate electrode comprising a mid-gap metal with a low work function/high oxygen affinity cap and a PMOS transistor with a metal gate electrode comprising a mid gap metal with a high work function/low oxygen affinity cap.

An advantage of the invention is providing a CMOS device with the desired band edge work functions for NMOS and PMOS transistors by controlling the oxygen concentration in the metal gate stack.

This and other advantages will be apparent to those of ordinary skill in the art having reference to the specification in conjunction with the drawings.

DETAILED DESCRIPTION OF THE EMBODIMENTS

Oxygen control in metal gate stacks is crucial in obtaining the desired band edge work functions. Oxygen at the interface between the metal gate and the dielectric is beneficial for obtaining high work function in PMOS devices. The opposite is true for NMOS where the ability to obtain low work function depends in part on the ability to denude the metal gate/dielectric interface of oxygen while at the same time incorporating a low work function metal at the interface. The invention provides a device and method for accomplishing oxygen control in metal gate stacks while incorporating a low work function metal at the interface in NMOS transistors.

Figure 1:
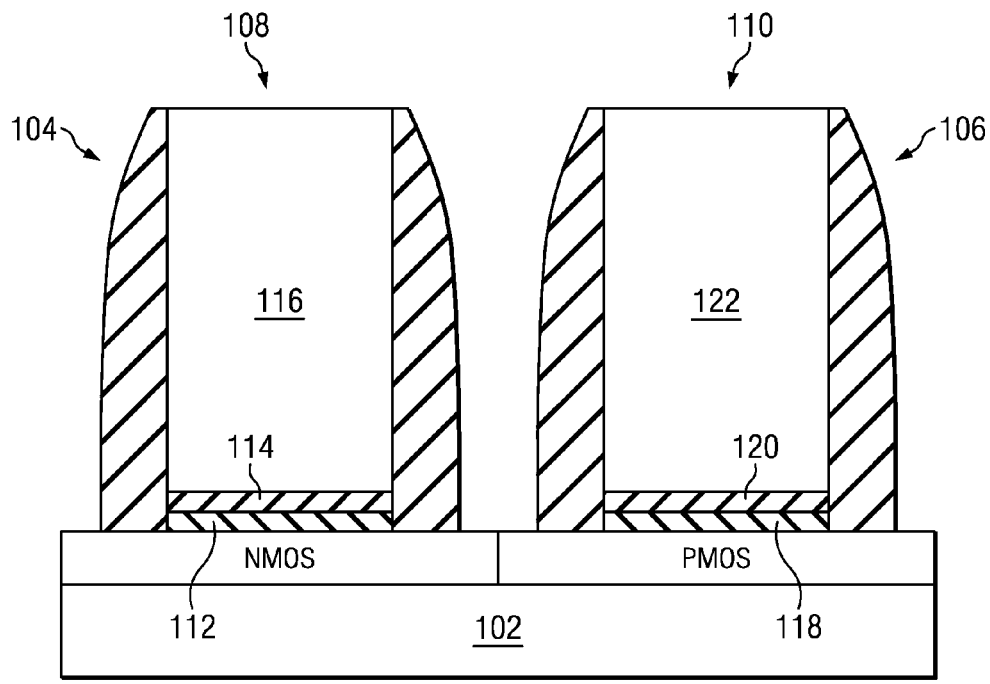
FIG. 1 is a cross-sectional diagram of a CMOS device according to an embodiment of the invention.

FIG. 1 illustrates a CMOS device 100 according to the invention. Device 100 includes an NMOS transistor 104 and a PMOS transistor 106 located at the surface of a semiconductor body 102. Semiconductor body 102 may, for example, comprise a silicon substrate with or without epitaxial layers formed thereon. Alternative examples include silicon-on insulator substrates, GaAs substrates and others used in the formation of integrated circuits. NMOS transistor 104 includes NMOS gate stack 108. While NMOS gate stack 108 is shown in detail, other conventional elements of NMOS transistor 104 such as source/drain regions are not shown. PMOS transistor 106 includes PMOS gate stack 110. While PMOS gate stack 110 is shown in detail, other conventional elements of PMOS transistor 104, such as source/drain regions, are not shown.

NMOS gate stack 108 comprises a gate dielectric 112, a mid-gap metal gate 114 and a high oxygen affinity/low work function cap layer 116. Gate dielectric 112 would typically comprise a gate dielectric material with a dielectric constant higher than that of silicon dioxide. For example, silicon-oxynitride may be used. Alternatively, higher dielectric constant materials such as hafnium oxide ($HfO_2$), and hafnium silicon oxy-nitride (HfSiON) may be used. Mid-gap metal gate 114 comprises a material such as TiN having a work function that is about mid-way between the valence band and the conduction band of the substrate. Alternative mid-gap metals include TiSiN, TaN, TaSiN, NiSi, WSi, MoN, and CoSi2. Cap layer 116 comprises a conductive material such as aluminum having a high oxygen affinity and low work function (i.e., <4.4 eV). Other suitable materials for cap layer 116 include Ti, Ta, Y, Hf, and lanthides. Cap layer 116 functions to denude the metal gate/gate dielectric interface of oxygen as well as to incorporate low work function material at the interface of the metal gate 114 and the gate dielectric 112 to lower the work function of the gate to that more appropriate for an NMOS transistor. Accordingly, it is desirable for the cap layer 116 to be located directly adjacent (or in direct contact with) the mid-gap metal gate 114.

PMOS gate stack 110 comprises gate dielectric 118, a mid-gap metal gate 120, and a low oxygen affinity/high work function cap layer 122. Gate dielectric 118 may comprise the same materials as gate dielectric 112. Mid-gap metal gate 120 may comprise the same materials as mid-gap metal gate 114. Rather than being a high oxygen affinity/low work function material, cap layer 122 comprises a low oxygen affinity/high work function material (i.e., >4.6 eV) such as tungsten. Other suitable materials include Mo, Pt, Re, and Ir. PMOS transistor 106 incorporates high levels of oxygen ($>10^{21}$ cm$^{-3}$) at the interface between the metal gate and the gate dielectric to obtain a high work function as appropriate for a PMOS transistor. Because cap layer 122 has a low oxygen affinity, oxygen is not significantly removed from the interface. In the embodiment shown in FIG. 1, cap layer 122 is in direct contact with mid-gap metal gate 120.

Providing a mid-gap metal gate with separate cap layers for NMOS and PMOS allows for a CMOS device with separately adjustable oxygen concentrations and work functions for NMOS and PMOS. The PMOS transistor can be designed with higher concentrations of oxygen ($>10^{21}$ cm$^{-3}$) to provide a higher work function (>5.1 eV) than the NMOS transistor with lower concentrations of oxygen ($<10^{20}$ cm$^{-3}$) and lower work function (<4.2 eV) metal incorporated at the gate-dielectric interface.

Figure 2A:
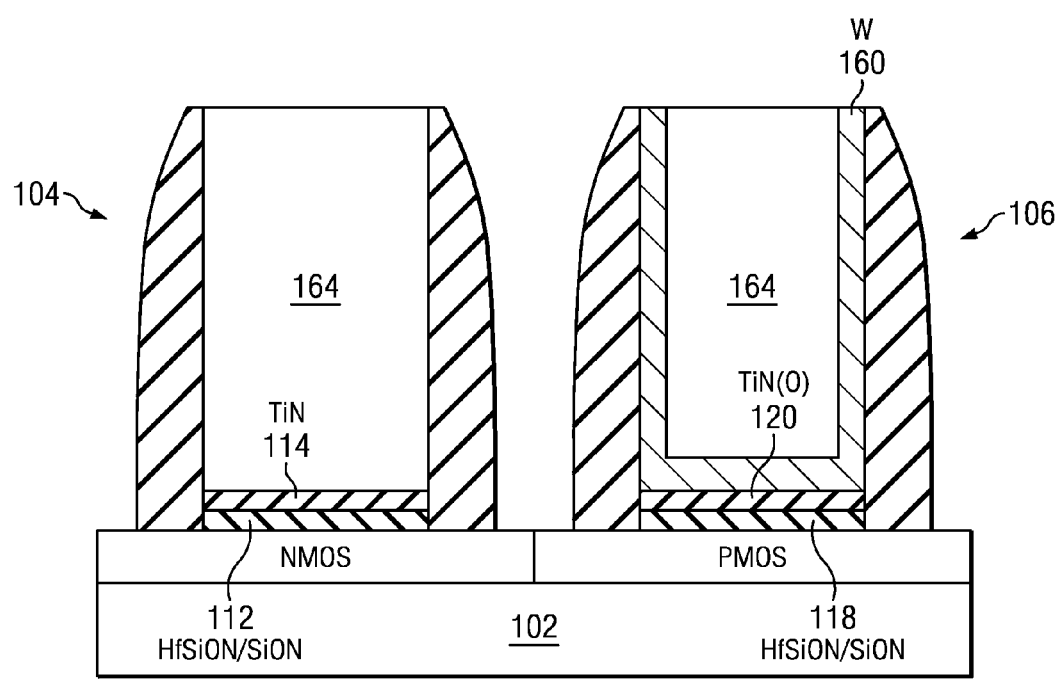
FIGS. 2A-2B are cross-sectional diagrams of a CMOS device according to alternative embodiments of the invention.
Figure 2B:
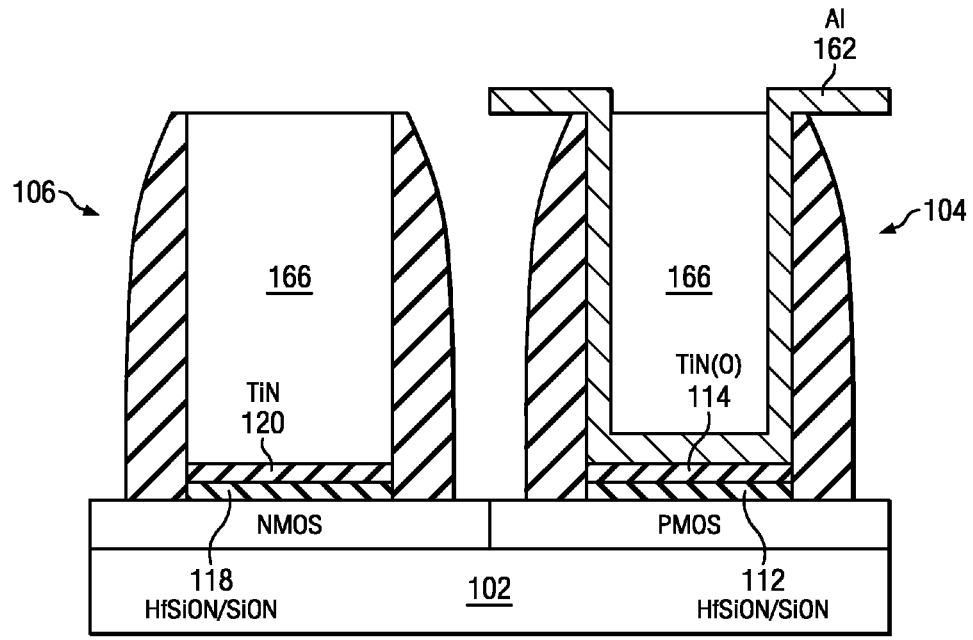

An alternative embodiment is shown in FIGS. 2A and 2B. Rather than using two fill cap layers as shown in FIG. 1, a thin cap layer 160/162 may be placed over one of the PMOS 106 or NMOS 104 transistors. The same thick cap layer 164/166 is then used over both the PMOS 106 and NMOS 104 transistors. In FIG. 2A, the thin cap layer 160 is a low oxygen affinity/high work function material and is present only in the PMOS transistor 106. The thick cap layer 164 is a high oxygen affinity/low work function material and is placed in both transistors, although separated from the mid-gap metal gate 120 by thin cap oxide 160. Thus, thick cap layer 164 functions to scavenge (remove) oxygen from mid-gap metal gate 114 only and is blocked from scavenging oxygen from mid-gap metal gate 120 by thin cap layer 160. In addition, low work function material is incorporated from the thick cap layer 164 to the metal gate-dielectric interface to lower the work function of the NMOS transistor 104 but not the PMOS transistor 106. The thin cap layer 160 and high oxygen concentration provide a high work function for the PMOS transistor 106 while the thick cap layer 164 and low oxygen concentration provide a low work function for the NMOS transistor 104.

The opposite case is shown in FIG. 2B. Here, the thin cap layer 162 is a high oxygen affinity/low work function material and is present only in NMOS transistor 104. The thick cap layer 166 is a low oxygen affinity/high work function material in both transistors. The thin cap layer 162 scavenges (removes) oxygen from mid-gap metal gate 114 but is not present in the PMOS transistor 106, so oxygen is not scavenged in the PMOS transistor 106. The thin cap layer 162 also incorporates low work function material into the mid-gap metal gate 114 at the metal gate/dielectric interface. The thick cap layer 166 and high oxygen concentration provide a high work function for the PMOS transistor 106 while the thin cap layer 162 and low oxygen concentration provide a low work function for the NMOS transistor 104.

The invention will now be described in conjunction with a method for forming a CMOS device using replacement gate technology. It will be apparent to those of ordinary skill in the art that the invention may be applied to other CMOS fabrication methods.

Figure 3A:
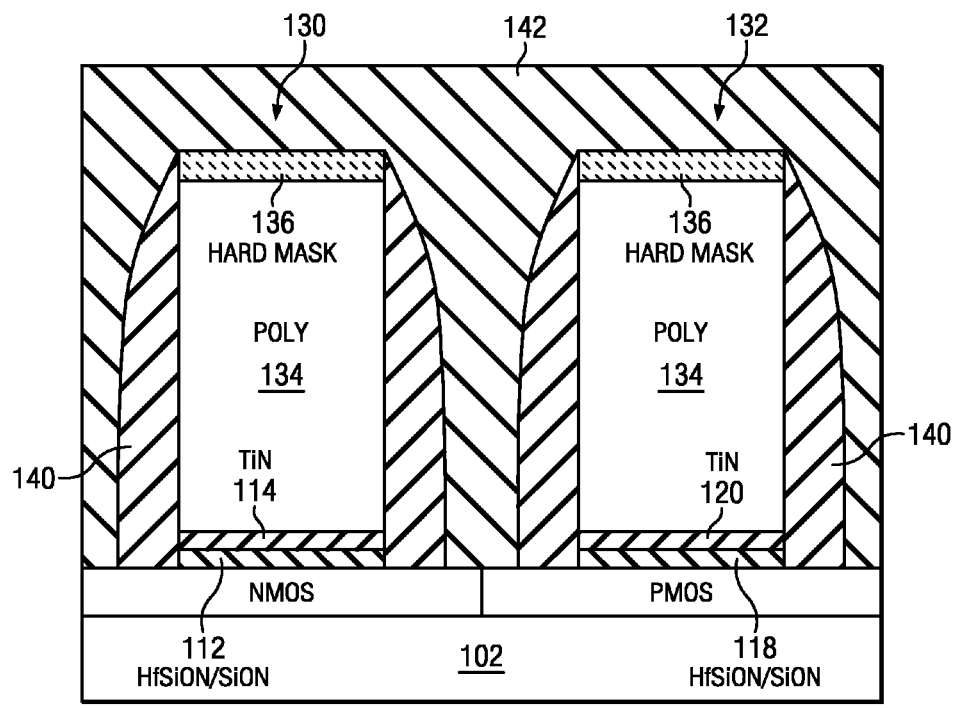
FIGS. 3A-3H are cross-sectional diagrams of a CMOS device at various stages of fabrication according to an embodiment of the invention

Referring to FIG. 3A, a semiconductor body 102 is processed through the formation of NMOS dummy poly gate 130, PMOS dummy poly gate 132, and oxide 142. As discussed previously semiconductor body 102 may comprise a silicon substrate, with or without epitaxial layers formed thereon or other appropriate semiconductor materials. NMOS dummy poly gate 130 includes a gate dielectric 112, a mid-gap metal gate 114, a dummy poly 134, hard mask 136, and sidewall spacers 138. PMOS dummy poly gate 132 includes a gate dielectric 118, mid-gap metal gate 120, dummy poly 134, hard mask 136, and sidewall spacers 140. For example, NMOS dummy poly gate 130 and PMOS dummy poly gate 132 may be formed simultaneously by depositing, in order, a gate dielectric layer, a metal gate layer, a polysilicon layer and a hard mask layer followed by patterning and etching to form the dummy gates. Although not shown, semiconductor body 102 has also been processed through the formation of source/drain regions. Other devices and structures (not shown) may have also been formed. Oxide 142 has been deposited and semiconductor body 102 is now ready for CMP (chemical mechanical polishing) and the removal of the dummy poly gates.

Figure 3B:
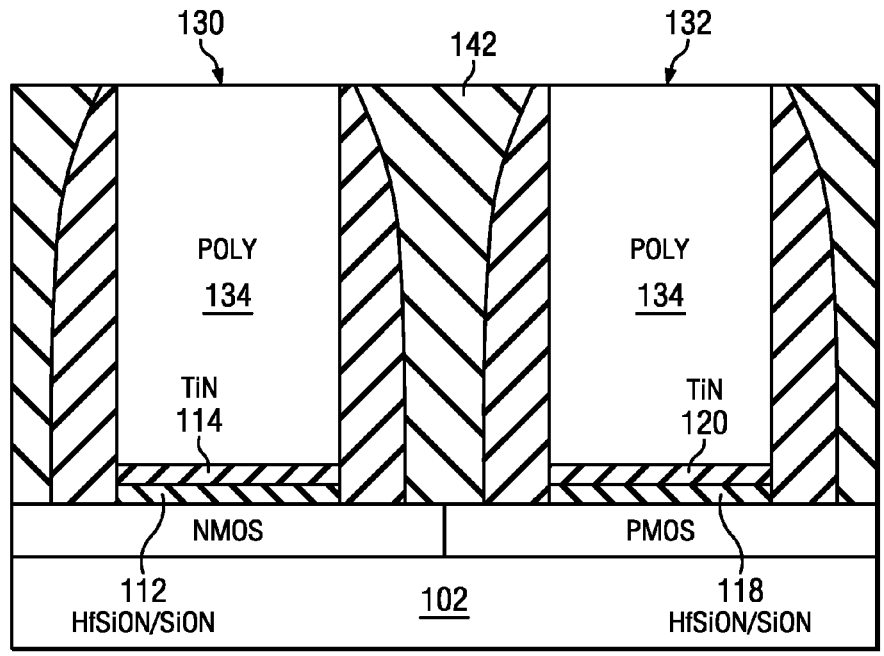

Referring to FIG. 3B, the surfaces of NMOS dummy poly gate 130 and PMOS dummy poly gate 132 are exposed. For example, CMP may be performed to remove oxide 142 down to the level of the gates and remove hard mask 136 thereby exposing NMOS dummy poly gate 130 and PMOS dummy poly gate 132.

Figure 3C:
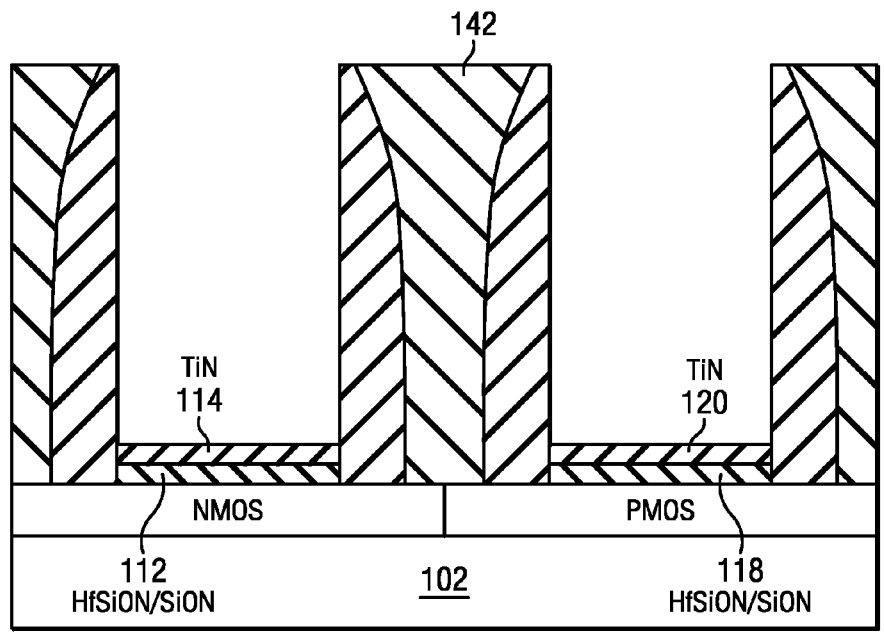
Figure 3D:
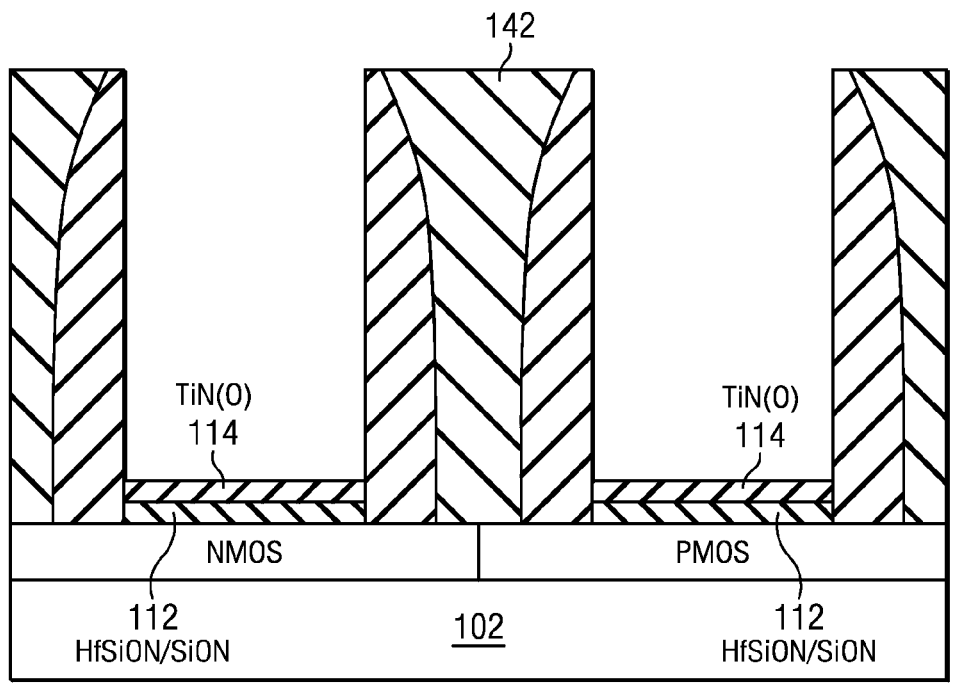

Next, dummy poly 134 is removed by etching as shown in FIG. 3C. After removing the dummy poly 134, mid-gap metal gates 114 and 120 are exposed. With mid-gap metal gates 114 and 120 exposed, a low temp oxidation is performed to incorporate oxygen into the mid-gap metal gates 114 and 120, as shown in FIG. 3D. For example an anneal in $O_2$ at a temperature in the range of 350° C. to 550° C. may be used. In one preferred embodiment a temperature of approximately 450° C. is used for a duration in the range of 15 s up to 180 s.

Figure 3E:
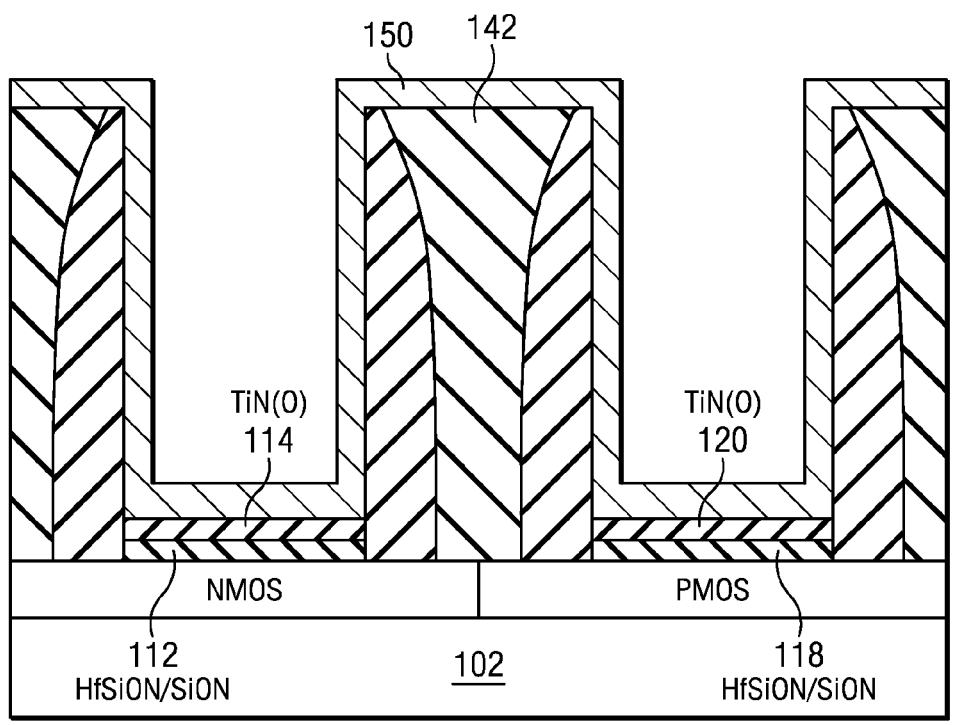

After oxidation, a thin cap layer 150 is deposited as shown in FIG. 3E. In one embodiment, thin cap layer 150 is a low oxygen affinity/high work function material and is intended to form part of the PMOS transistor but not the NMOS transistor similar to that shown in FIG. 2A. In such case thin cap layer 150 may comprise tungsten (W). Alternative examples include Mo, Pt, Re and Ir. In a separate embodiment, thin cap layer 150 is a high oxygen affinity/low work function material and is intended to form part of the NMOS transistor but not the PMOS transistor similar to FIG. 2B. In this case the thin cap layer 150 may comprise Al. Alternative examples include Ti, Ta, Y, Hf, and lanthides. The remaining figures assume the case where thin cap layer is a low oxygen affinity/high work function material. One of ordinary skill in the art will understand to reverse the situation for a high oxygen affinity/low work function cap layer.

Figure 3F:
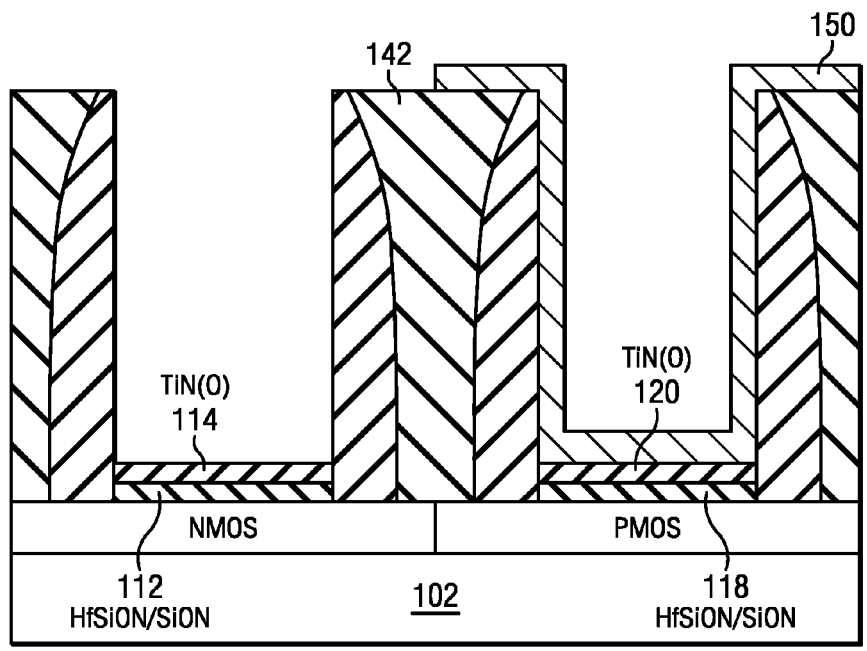

Next, thin cap layer 150 is patterned and etched as shown in FIG. 3F. If thin cap layer 150 is a low oxygen affinity/high work function material, it is removed from the NMOS transistor but remains on the PMOS transistor as shown in FIG.

3F. On the other hand, if it is a high oxygen affinity/low work function material such as Al, it is removed from the PMOS transistor and remains in the NMOS transistor.

Figure 3G:
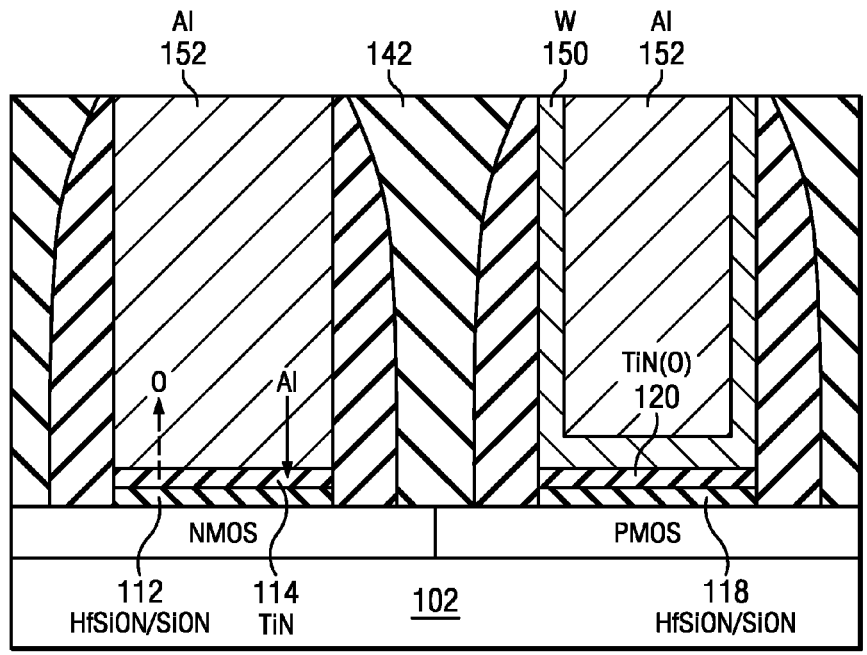

Referring to FIG. 3G, a thick cap layer 152 is deposited. Thick cap layer 152 has the opposite oxygen affinity and work function of thin cap layer 150. For example, if thin cap layer 150 is a low oxygen affinity/high work function material, then thick cap layer is a high oxygen affinity/low work function material such as Al, Ti, Ta, Y, Hf, or lanthide. However, if thin cap layer 150 is a high oxygen affinity/low work function material, then thick cap layer 152 is a low oxygen affinity/high work function material such as W, Mo, PT, Re, or Ir. Thick cap layer 152 may be deposited to overfill the holes left by the removal of the dummy poly and then CMP'd back until it is even with the surface of oxide 142.

CMP is followed by a 350-550° C. anneal. During the anneal, oxygen is attracted to the high oxygen affinity cap layer and removed from the mid-gap metal gate 114 of the NMOS transistor. In addition, low work function metal is incorporated into the mid-gap metal gate 114 at the metal gate/dielectric interface to lower the work function of the metal gate in the NMOS transistor. In FIG. 3G, thick cap layer 152 is the high oxygen affinity material that removes oxygen from the mid-gap metal gate 114. In the reverse situation (not shown) where the thin cap layer 150 is the high oxygen affinity material and present in the NMOS transistor, the thin cap layer 150 would attract oxygen out of the mid-gap metal gate 114. Removing oxygen from the mid-gap metal gate 114 in conjunction with the low work function material contributes to a lower work function in the NMOS transistor. The low oxygen affinity material does not attract significant oxygen from the mid gap metal gate 120 of the PMOS transistor. The higher oxygen concentration in mid-gap metal gate 120 contributes to a higher work function in the PMOS transistor.

Figure 3H:
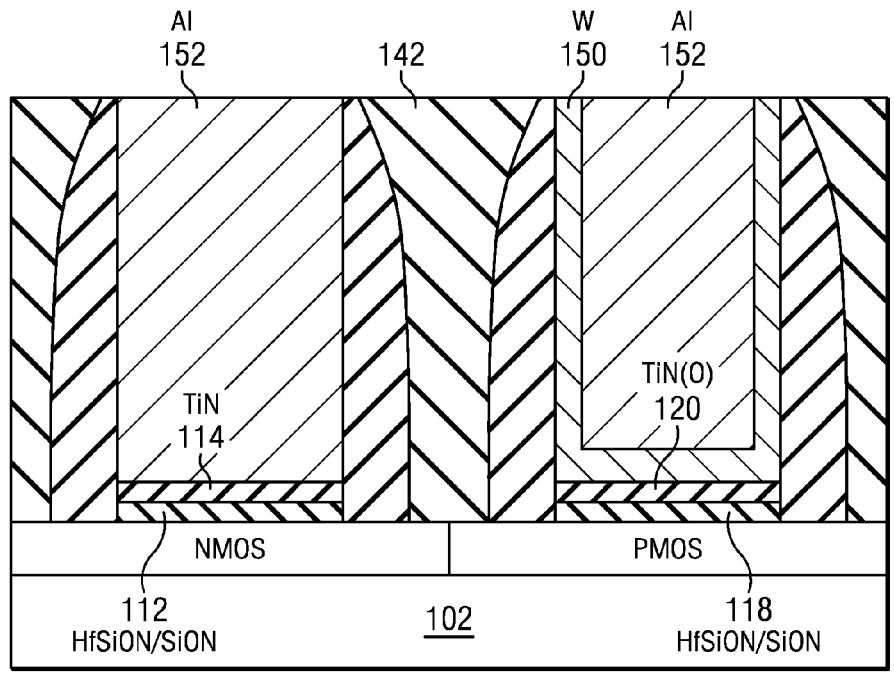

After the anneal, oxide layer 142 is removed as shown in FIG. 3H. Processing then continues with the formation of contacts and back end of line processing and packaging.

Figure 4A:
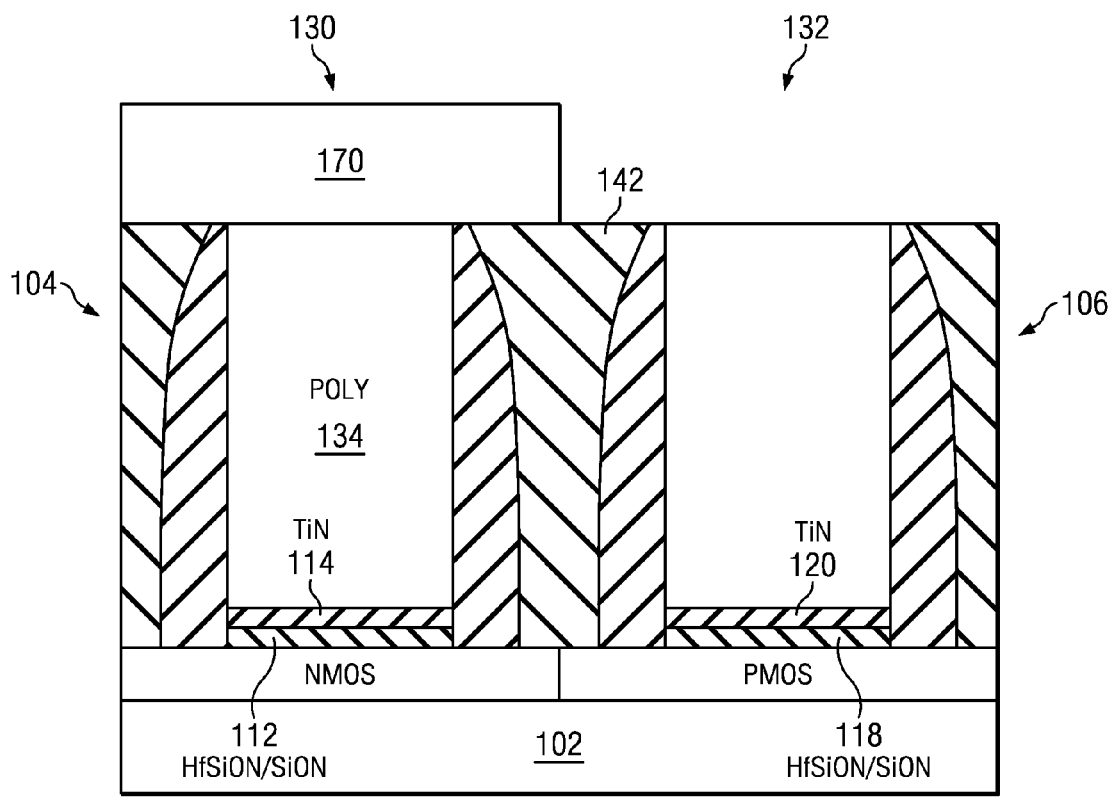
FIGS. 4A-4E are cross-sectional diagrams of a CMOS device at various stages of fabrication according to an alternative embodiment of the invention.

An alternative method for forming a CMOS device according to the invention will now be discussed with reference to FIGS. 4A-4E. A semiconductor body 102 is processed through the formation of NMOS dummy gate stack 130, PMOS dummy gate stack 132, and oxide 142 followed by CMP to remove the hard mask 136 as discussed above relative to FIGS. 3A-3B. Then, instead of removing both dummy polys 134, only the dummy poly 134 of the PMOS transistor 106 is removed, as shown in FIG. 4A. The dummy poly 134 of the NMOS transistor 104 is covered by a masking layer 170 and not removed at this time.

Figure 4B:
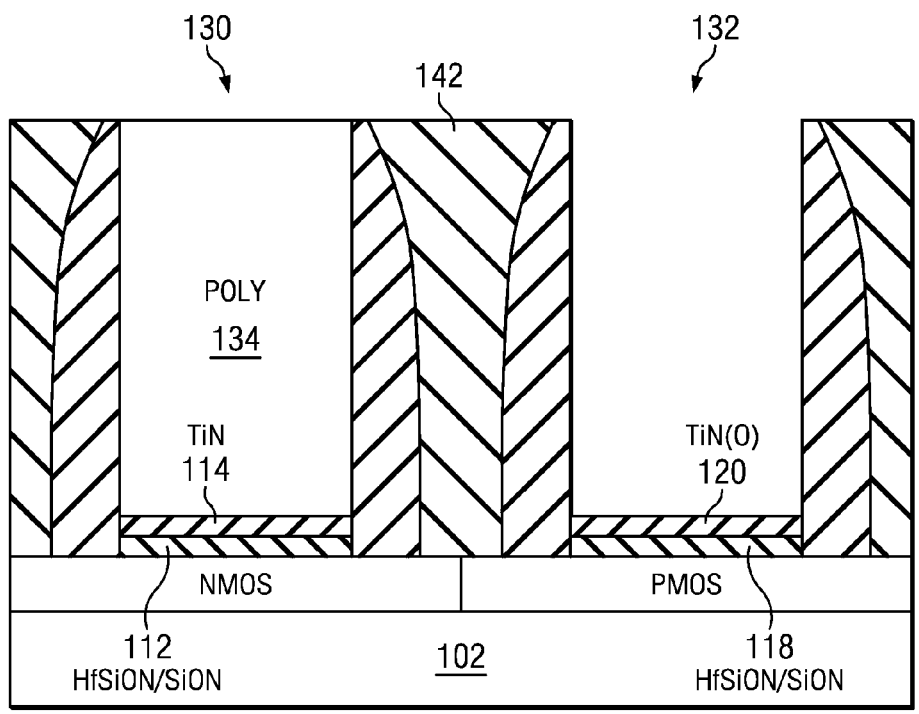

After removing the dummy poly 134 of the PMOS dummy gate stack 132, the masking layer 170 is removed as shown in FIG. 4B. A low temperature oxidation is then performed. The low temperature oxidation may be an anneal in $O_2$ at a temperature in the range of 350° C. to 550° C. Other suitable low temperature oxidations will be apparent to those of ordinary skill in the art. Because only the mid-gap metal gate 120 is exposed, oxygen is only incorporated into the mid-gap metal gate 120 and not into the unexposed mid-gap metal gate 114.

Figure 4C:
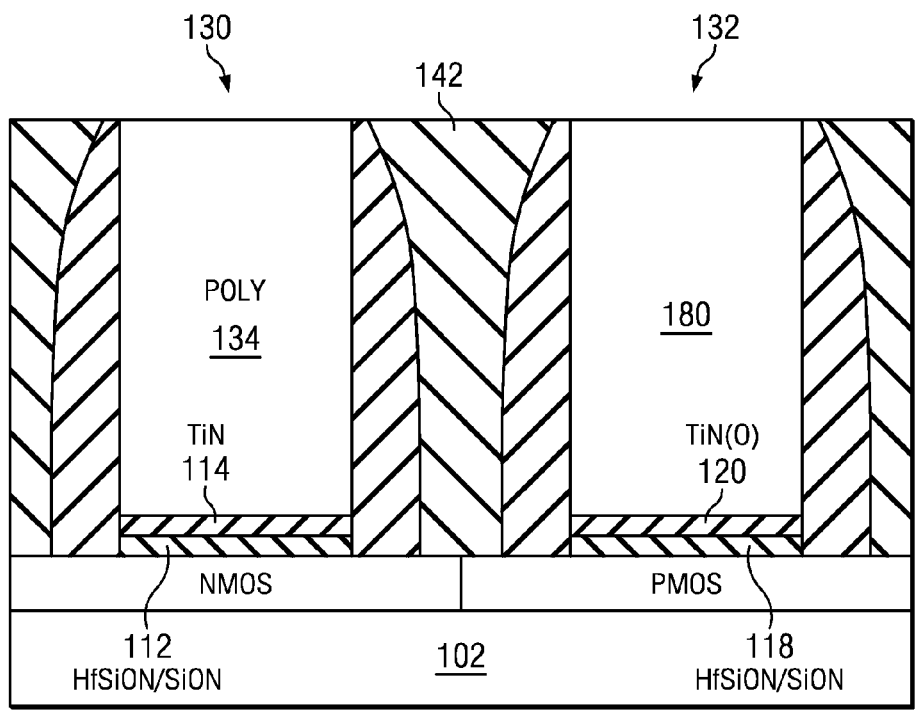

The hole left by the removal of the dummy gate poly 134 in the PMOS transistor 106 is then filled with a first cap layer 180. First cap layer 180 is a low oxygen affinity/high work function material such as W. Alternative materials include Mo, Pt, Re, and Ir. First cap layer 180 may be deposited and CMP'd back until even with the surface of oxide 142 as shown in FIG. 4C. First cap layer 180 has a low oxygen affinity and thus does not remove a significant amount of oxygen from mid-gap metal gate 120. First cap layer 180 further provides a high work function for the PMOS transistor.

Figure 4D:
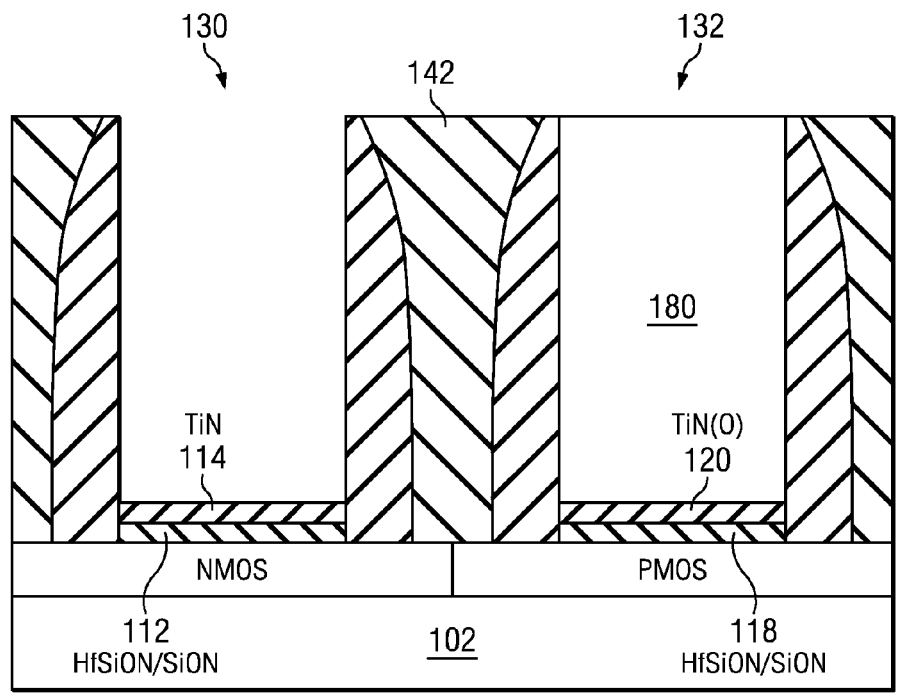

Referring to FIG. 4D, the dummy poly 134 of NMOS dummy gate stack 130 is removed. A selective etch may be used to remove dummy poly 134 without removing oxide 142 or first cap layer 180. One exemplary etch chemistry is a $NH_4OH$ containing solution.

Figure 4E:
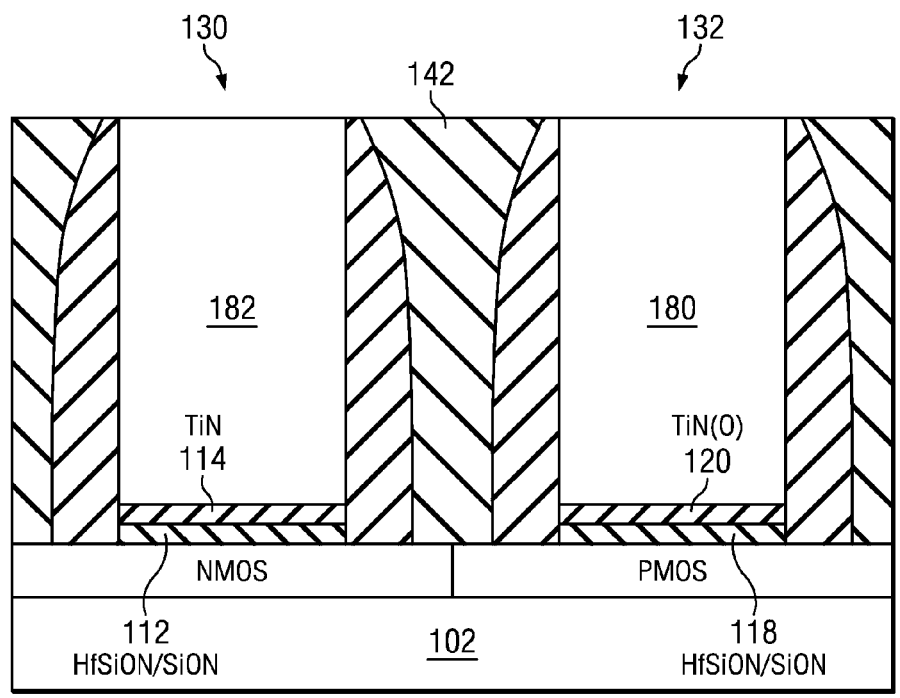

Next, a second cap layer 182 is deposited as shown in FIG. 4E. Second cap layer 182 is a high oxygen affinity/low work function material such as Al. Alternative materials include TI, Ta, Y, Hf, and lanthides. Second cap layer 182 may be deposited and the CMP'd back to even with the surface of oxide 142. Second cap layer provides a low work function for the NMOS transistor by incorporating low work function material into the mid-gap metal gate 114 at the metal gate/dielectric interface to provide a lower work function.

Processing then continues to remove oxide 142, form contacts and perform back end processing and packaging.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the method of FIGS. 4A-4D may be modified to form the second cap layer 182 before forming the first cap layer 180. It is therefore intended that the appended claims encompass any such modifications or embodiments.

The invention claimed is:

1. A device comprising:
   an NMOS transistor with a first gate dielectric, first mid-gap metal gate, and a first cap layer, wherein the first cap layer comprises a material having a high oxygen affinity and low work function; and
   a PMOS transistor with a second gate dielectric, second mid gap metal gate and a second cap layer, wherein the second cap layer comprises a material having a low oxygen affinity and high work function.

2. The device of claim 1, wherein the first mid-gap metal gate has a lower oxygen concentration than the second mid-gap metal gate and wherein low work function material from the first cap layer is incorporated at an interface between the first mid-gap metal gate and the first gate dielectric.

3. The device of claim 1, wherein the first cap layer comprises Al.

4. The device of claim 1, wherein the first cap layer comprises a material selected from the group consisting of Al, Ti, Ta, Y, Hf, and lanthides.

5. The device of claim 4, wherein the second cap layer is selected from the group consisting of W, Mo, Pt, Re, and Ir.

6. The device of claim 1, wherein the second cap layer comprises W.

7. The device of claim 1, wherein the NMOS transistor further comprises the second cap layer separated from the first mid-gap metal gate by the first cap layer.

8. The device of claim 1, wherein the PMOS device further comprises the first cap layer separated from the second mid-gap metal gate by the second cap layer.

9. The device of claim 1, wherein the first mid-gap metal gate and the second mid-gap metal gate comprise the same mid-gap metal.

10. A method of forming a device, comprising the steps of:
    providing a semiconductor body having a NMOS gate stack, a PMOS gate stack, and an oxide layer formed thereon, wherein the NMOS gate stack comprises a first gate dielectric, a first mid-gap metal gate, and a first dummy poly layer and the PMOS gate stack comprises a second gate dielectric, a second mid-gap metal gate, and a second dummy poly layer;

removing the first dummy poly layer;

forming a first cap layer over the first mid-gap metal gate, the first cap layer comprising a high oxygen affinity and low work function material;

removing the second dummy poly layer;

forming a second cap layer over the second mid-gap metal gate, the second cap layer comprising a low oxygen affinity and high work function material;

after removing the second dummy poly layer and prior to forming the second cap layer, performing a low temperature oxidation to incorporate oxygen into the second mid-gap metal gate; and annealing to incorporate low work function material from the first cap layer into the first mid-gap metal gate at the interface between the first mid-gap metal gate and the first gate dielectric.

11. The method of claim 10, wherein the first cap layer comprises Al.

12. The method of claim 11, wherein the second cap layer comprises W.

13. The method of claim 10, wherein the first cap layer comprises a material selected from the group consisting of Al, Ti, Ta, Y, Hf, and lanthides and wherein the second cap layer is selected from the group consisting of W, Mo, Pt, Re, and Ir.

14. The method of claim 10, wherein the second dummy poly layer is removed prior to removing the first dummy poly layer.

15. The method of claim 10, wherein the step of forming the second cap layer comprises:

depositing the second cap layer over both the NMOS gate stack and the PMOS gate stack; and removing the second cap layer from the NMOS gate stack;

and wherein the step of forming the first cap layer comprises:

after removing the second cap layer from the NMOS gate stack, depositing the first cap layer over both the NMOS gate stack and the second cap layer of the PMOS gate stack.

16. The method of claim 15, wherein the second cap layer is a thin cap layer compared to the first cap layer.

17. A device comprising:

an NMOS transistor with a first gate dielectric, first mid-gap metal gate, and a first cap layer, wherein the first cap layer comprises Aluminum having a high oxygen affinity and low work function; and a PMOS transistor with a second gate dielectric, second mid-gap metal gate and a second cap layer, wherein the second cap layer comprises Tungsten having a low oxygen affinity and high work function, wherein the first mid-gap metal gate and the second mid-gap metal gate comprise the same mid-gap metal material.

* * * * *